United States Patent [19]
Nakayama

[11] Patent Number: 5,432,810
[45] Date of Patent: Jul. 11, 1995

[54] SEMICONDUCTOR LAYER HAVING FIRST AND SECOND CLADDING LAYERS AND AN ACTIVE LAYER FORMED OF A II-VI GROUP COMPOUND AND A CURRENT CONFINEMENT LAYER COMPRISING A METAL OXIDE

[75] Inventor: Norikazu Nakayama, Kanagawa, Japan

[73] Assignee: Sony Corporation, Tokyo, Japan

[21] Appl. No.: 261,195

[22] Filed: Jun. 16, 1994

[30] Foreign Application Priority Data

Jun. 18, 1993 [JP] Japan .................. 5-147957

[51] Int. Cl.⁶ .............................. H01S 3/19
[52] U.S. Cl. ........................................... 372/46
[58] Field of Search ........................ 372/46, 45, 44

[56] References Cited
U.S. PATENT DOCUMENTS 4,955,031 9/1990 Jain ......................... 372/45

FOREIGN PATENT DOCUMENTS 5275803 10/1993 Japan ..................... 372/45
6021572 1/1994 Japan ..................... 372/45

Primary Examiner—James W. Davie
Attorney, Agent, or Firm—Hill, Steadman & Simpson

[57] ABSTRACT

A semiconductor layer comprises a first cladding layer of a first conductivity type on a substrate, an active layer laminated on the first cladding layer, a second cladding layer of a second conductivity type laminated on the active layer, and a current confinement layer on the second cladding layer. The first cladding layer, the active layer and the second cladding layer are made of a II-VI group compound semiconductor and the current confinement layer is made of a metal oxide whose thermal conductivity is equal to or larger than 0.01 cal/cm·s·°C. A silicon layer is provided between the current confinement layer and an electrode. The current confinement layer is provided on an upper portion of a p type semiconductor layer. With the semiconductor laser made of the II-VI group compound semiconductor of a ZnSe system or the like, a heat-radiation characteristic thereof can be improved and long-time operation thereof is made possible.

10 Claims, 4 Drawing Sheets

SEMICONDUCTOR LAYER HAVING FIRST AND SECOND CLADDING LAYERS AND AN ACTIVE LAYER FORMED OF A II-VI GROUP COMPOUND AND A CURRENT CONFINEMENT LAYER COMPRISING A METAL OXIDE

BACKGROUND OF THE INVENTION

The present invention relates to a semiconductor laser and particularly to a semiconductor laser whose active layer is made of a II-VI group compound semiconductor material and a manufacturing method thereof.

It is difficult to obtain a satisfactory ohmic contact at a p side in a semiconductor laser in which a II-VI group compound semiconductor material of ZnSe system or the like is used. Therefore, there are the disadvantages in the prior art that generation of heat at a contact portion causes a deterioration of an electrode, that a rise in temperature of an element makes long-time operation difficult, or the like.

Construction of the ZnSe system semiconductor laser as an example will be explained with reference to FIGS. 1A to 1C showing manufacturing processes thereof. In this case, first, as shown in FIG. 1A, a first cladding layer 2 made of an n type ZnMgSSe or the like, an active layer 3 made of an undoped ZnCdSe or the like, a second cladding layer 4 made of a p type ZnMgSSe or the like, a buffer layer 5 made of a p type ZnSe or the like and further a contact layer 6 having a p type ZnSe/ZnTe superlattice structure are successively epitaxially grown on a substrate 1 made of an n type GaAs or the like. A photoresist 10 is coated on the contact layer 6 and is then subjected to patterning by pattern exposure and development in a striped fashion in order to cover a region where a striped current path is to be formed. When using the photoresist 10 as a resist mask, the contact layer 6 is subjected to the patterning by chemical etching or the like so as to have a striped shape. At this time, until a part of each of the buffer layers 5 at both sides of the contact layer 6 is removed, the etching is performed.

Then, after the photoresist 10 is removed and then a polyimide 11 is coated on the whole surface, as shown in FIG. 1B, only the contact layer 6 is exposed by a proper photolithography technique.

Next, as shown in FIG. 1C, an electrode 8 formed of a multilayer film of Pd/Pt/Au or the like is formed by vacuum evaporation or the like so as to completely cover the polyimide 11 and the contact layer 6. Reference numeral 9 represents an electrode which is made of In or the like, and which is previously formed by a coating on a rear surface of the substrate 1, for example, or the like.

As described above, the polyimide 11 blocks the current, and the region sandwiched by the polyimide 11 is set as the striped current path, thereby constructing a semiconductor laser of a gain waveguide type.

The polyimide 11 has the advantages that it has excellent adhesion properties to ZnSe and to a p side electrode, it can be formed as a film by a process at a comparatively low temperature, and does not damage crystallinity of other portions.

However, the above-mentioned semiconductor laser of a gain waveguide type has the disadvantage that since most injected current is concentrated on a portion just beneath an electrode having a large contact resistance, it cannot be avoided that Joule heat generated around the electrode deteriorates the electrode portion and raises the temperature of the entire laser element.

There can be considered a countermeasure against this that the p side electrode is located at a lower portion of the element in order to suppress a rise of temperature of the element, and it is mounted on a heat sink having very high thermal conductivity. However, there is then the problem that since the polyimide 11 is provided on a portion occupying a comparatively large area between the p side electrode and the cladding layer, the heat cannot be effectively dissipated.

SUMMARY OF THE INVENTION

According to the present invention, and particularly for a II-VI group compound semiconductor laser of a ZnSe system or the like, the heat-radiation characteristic can be improved, and long-time operation thereof is made possible.

A semiconductor laser according to the present invention comprises a first cladding layer of a first conductivity type on a substrate, an active layer laminated on the first cladding layer, a second cladding layer of a second conductivity type laminated on the active layer, and a current confinement layer on the second cladding layer. The first cladding layer, the active layer and the second cladding layer are made of a II-VI group compound semiconductor, and the current confinement layer is made of a metal oxide whose thermal conductivity is equal to or larger than 0.01 cal/cm·s·°C.

According to the present invention having the above-mentioned construction, a silicon layer is provided between the current confinement layer and an electrode.

Further, according to the present invention having the above-mentioned construction, the current confinement layer is provided on an upper portion of a p type semiconductor layer.

DETAILED DESCRIPTION OF THE PREFERRED EMBODIMENTS

Figure 2:
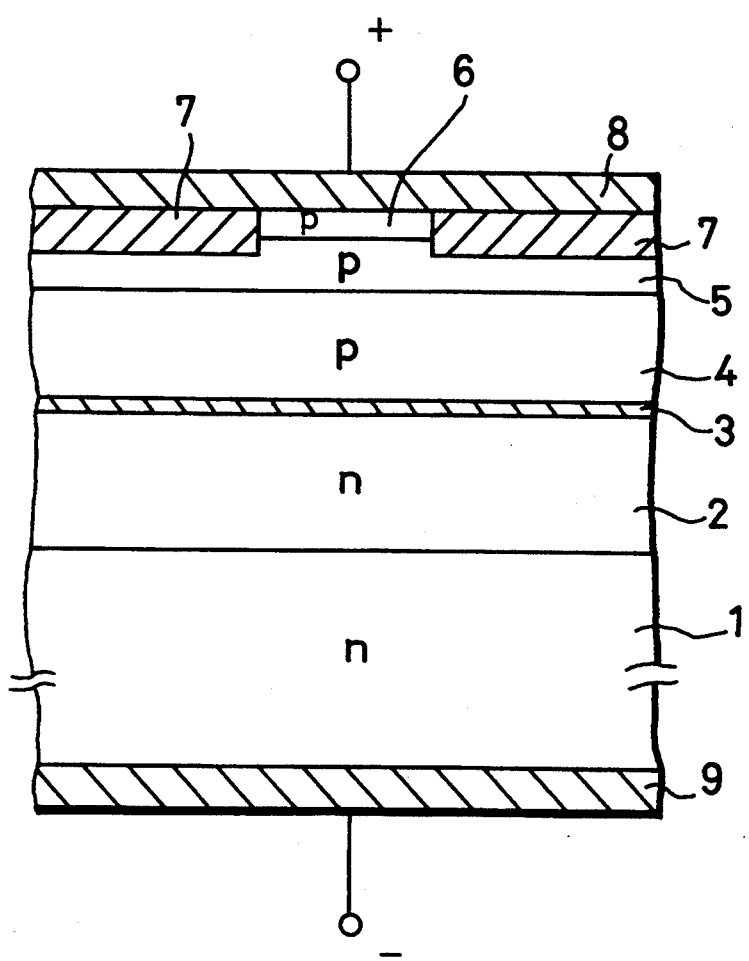
FIG. 2 is a schematically enlarged and cross-sectional view of an embodiment according to the present invention.

Through study and research of the inventor of the present invention, it was found that, as shown in FIG. 2 which is a schematically enlarged and cross-sectional view of one embodiment of the present invention, when a semiconductor laser is constructed whose active layer is made of a II-VI group compound semiconductor, and wherein a metal oxide is employed as a current confinement layer having a satisfactory thermal conductivity such that at 100° C. the thermal conductivity is equal to or larger than 0.01 cal/cm·s·°C., then a sufficient heat-radiation characteristic is obtained and the element can be operated for a long period of time.

A silicon layer is provided between the current confinement layer 7 made of this metal oxide and an electrode 8 thereon, whereby adhesion between the current confinement layer 7 made of the metal oxide and the electrode 8 can be improved, and a peeling off or the like is prevented so that a highly reliable semiconductor laser is provided.

Figure 3A:
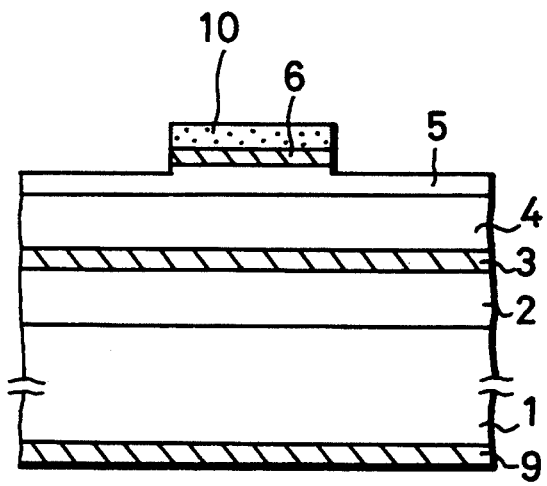
FIGS. 3A, 3B and 3C are manufacturing process diagrams of the embodiment according to the present invention.
Figure 3B:
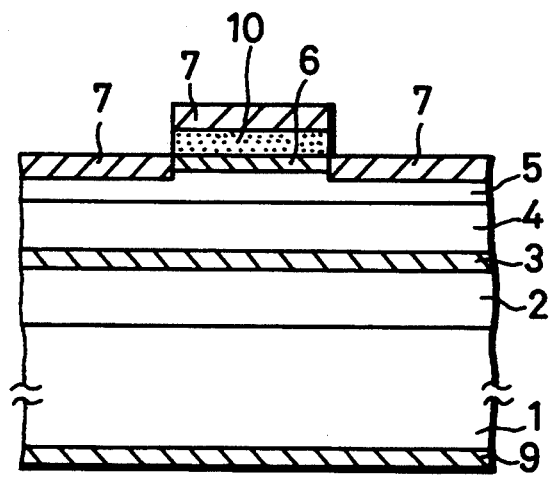
Figure 3C:
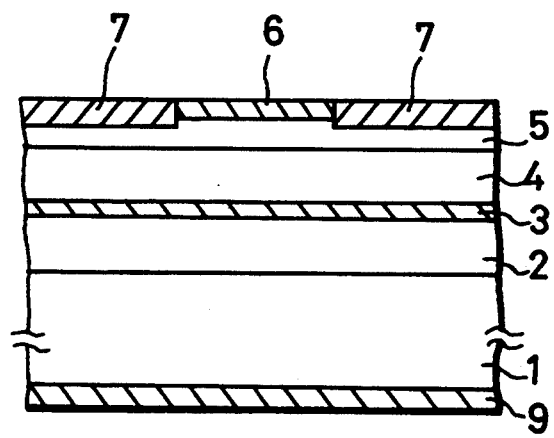

Such a current confinement layer 7, as shown in FIGS. 3A to 3C which show a manufacturing process of one example thereof, is formed in self-aligned fashion by using a resist 10 on a striped current path as a mask. A positional displacement thereof relative to a contact layer 6 is suppressed and the number of manufacturing processes is reduced so that an improvement in productivity can be achieved.

An embodiment according to the present invention will hereinafter be explained with reference to the accompanying drawings. This example is the case where a ZnSe system compound semiconductor laser is constructed on a GaAs substrate, and one example of a manufacturing method thereof will first be explained in detail with reference to FIGS. 3A to 3C.

As shown in FIG. 3A, reference numeral 1 represents a substrate made of an n type GaAs, for example, in which an electrode 9 made of, for example, In or the like is coated as an n side electrode on a rear surface thereof, and is formed by heating and melting in succeeding epitaxial growth process. On the substrate 1, a first cladding layer 2 made of an n type ZnMgSSe or the like, an active layer 3 made of undoped ZnCdSe or the like, a second cladding layer 4 made of a p type ZnMgSSe or the like, a buffer layer 5 made of a p type ZnSe or the like and further a contact layer 6 having a p type ZnSe/ZnTe superlattice structure, for example, are successively epitaxially grown by an MOCVD (metal organic chemical vapor deposition), an MBE (molecular beam epitaxy) or the like.

Next, the photoresist 10 is coated on the contact layer 6 and is then subjected to patterning by pattern exposure and development in a striped fashion so as to cover a region where a striped current path is to be formed. By using the photoresist 10 as a resist mask, the contact layer 6 is subjected to the patterning by chemical etching or the like so as to have a striped shape. At this time, until a part of each of the buffer layers 5 at both sides of the contact layer 6 is removed, the etching is performed.

Next, as shown in FIG. 3B, with the photoresist 10 remaining, the current confinement layer 7 made of a metal oxide whose thermal conductivity at 100° C. is equal to or larger than 0.01 cal/cm·s·°C., for example, Al$_2$O$_3$ whose thermal conductivity is 0.07 cal/cm·s·°C. (a value at 100° C. of the thermal conductivity will hereinafter be shown as a value of the thermal conductivity) is deposited by the vacuum evaporation or the like on the entire surface.

As shown in FIG. 3C, after the photoresist and the Al$_2$O$_3$ thereon are removed to expose the contact layer 6, as shown in FIG. 2, the electrode 8 formed of a multilayer film of Pd/Pt/Au or the like is formed on the entire surface by vacuum evaporation or the like. Thus, there is constructed a semiconductor laser of a gain waveguide type in which a region surrounded by the current confinement layer 7 made of the above-mentioned metal oxide is formed as a striped current path.

In this case, a photolithography process is required once, and the current confinement layer 7 can be formed in self-alignment fashion simultaneously with the patterning of the contact layer 6, so that a positional displacement between the contact layer 6 and the current confinement layer 7 can be suppressed.

Figure 1A:
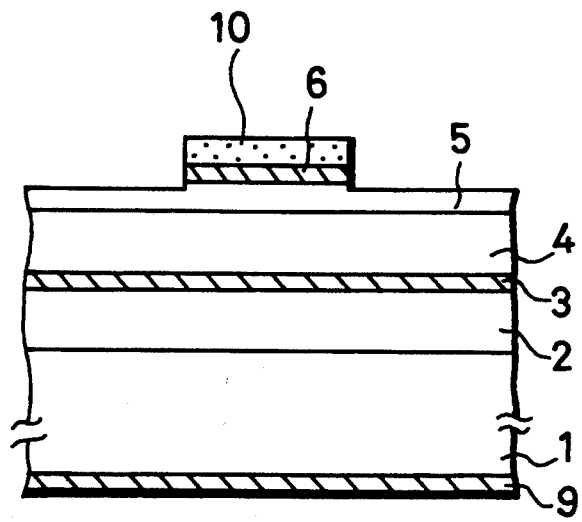
FIGS. 1A, 1B and 1C are manufacturing process diagrams of one example of a semiconductor laser.
Figure 1B:
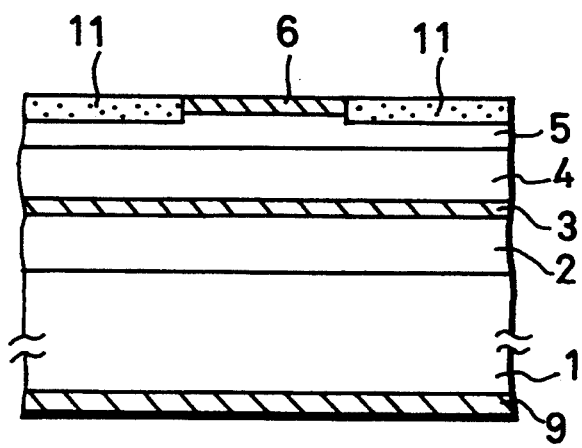
Figure 1C:
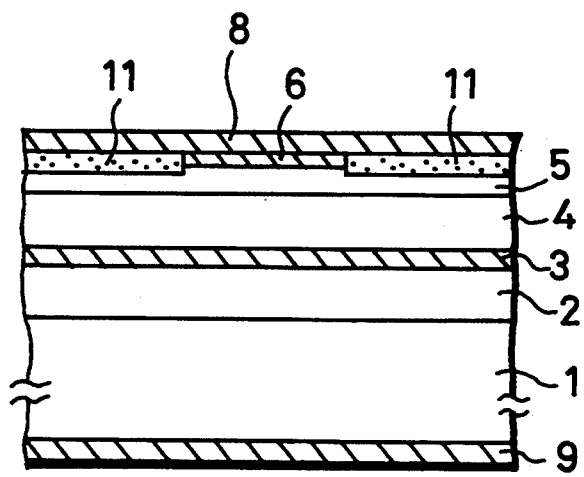

That is, when a polyimide is used as the current confinement layer on the p type semiconductor layer in the prior art, photolithography is required twice, as explained in the above FIGS. 1A to 1C which show a manufacturing process thereof, according to the present invention, however, the number of photolithography processes can be reduced to one, and hence the number of manufacturing processes can be reduced and further productivity can be improved.

Figure 4:
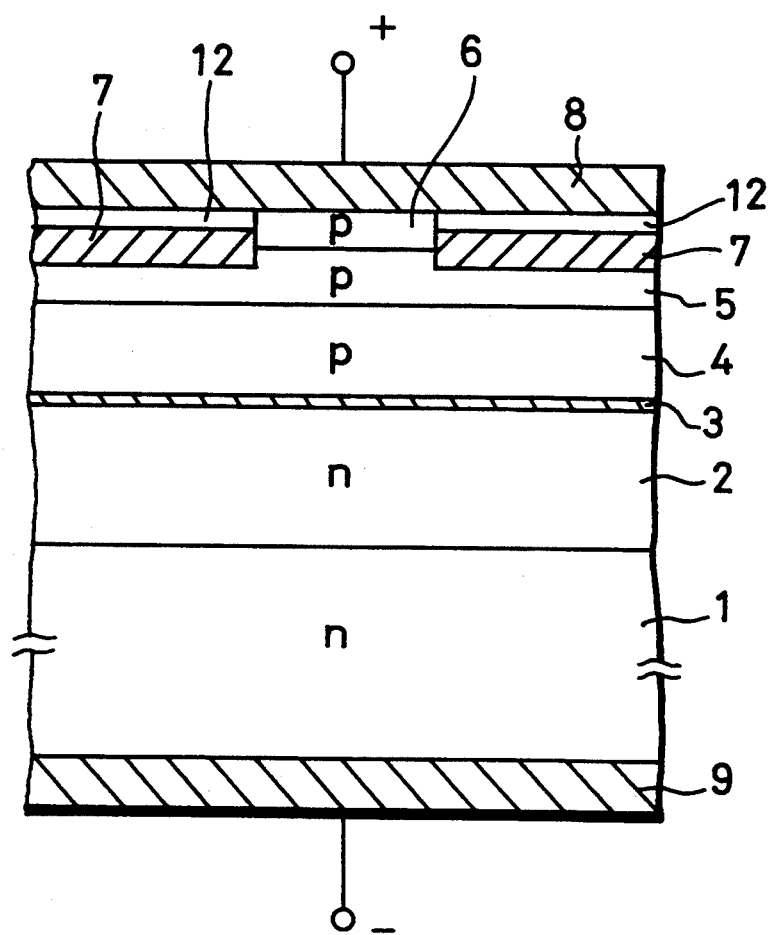
FIG. 4 is a schematically enlarged and cross-sectional view of another embodiment according to the present invention.

A silicon layer 12 is provided between the current confinement layer 7 and the electrode 8 as shown in FIG. 4, whereby adhesion at this portion can be made sufficiently large. A forming method of the silicon layer 12 proceeds in such a manner that in the above-mentioned process shown in FIG. 3B, for example, after the current confinement layer 7 made of the metal oxide is deposited by the vacuum evaporation, the silicon layer 12 is deposited by the vacuum evaporation on the entire surface and then can be formed in self-alignment fashion by similarly removing the photoresist. The silicon is high in thermal conductivity as compared with the metal oxide such as Al$_2$O$_3$ or the like, so that a drastic deterioration of the heat-radiation characteristic can be avoided as compared with the case where only the metal oxide is used.

Besides the above-mentioned Al$_2$O$_3$, it is sufficient for a material of the current confinement layer 7 that the thermal conductivity is equal to or larger than 0.01 cal/cm·s·°C. As a material which can have the property of self-alignment, that is, which can be deposited by vacuum evaporation, there can be used a material such as MgO whose thermal conductivity is 0.09 cal/cm·s·°C., BeO whose thermal conductivity is 0.53 cal/cm·s·°C., or the like.

The thermal conductivity of the polyimide is within the range from 0.0003 to 0.0005 cal/cm·s·°C. An insulating material whose thermal conductivity is higher than that of the polyimide is SiO$_2$, for example, whose thermal conductivity is 0.005 cal/cm·s·°C. When SiO$_2$ is employed as the current confinement layer of the semiconductor laser having the active layer formed of the above-mentioned II–VI group compound semiconductor, a sufficient heat-radiation characteristic could not be obtained. Accordingly, in the present invention, a metal oxide whose thermal conductivity is equal to or larger than 0.01 cal/cm·s·°C. is used.

As described above, according to the present invention, in the semiconductor laser made of a II–VI group compound semiconductor of a ZnSe system or the like, the heat-radiation characteristic thereof can be improved and a long-time operation thereof is made possible.

The number of lithographic processes in the manufacture thereof can be reduced to one, whereby the number of the manufacturing processes can be reduced and the productivity thereof can be improved.

Further, the silicon layer is provided between the current confinement layer and the electrode, whereby the adhesion property thereof can be improved and hence a more reliable semiconductor laser can be provided.

Having described preferred embodiments of the invention with reference to the drawings, it is to be understood that the invention is not limited to these precise embodiments, and that various changes and modifications can be effected therein by one skilled in the art without departing from the spirit or scope of the novel concepts of the invention as defined in the appended claims.

What is claimed is:

1. A semiconductor laser, comprising:
   a semiconductor substrate having a first electrode connected thereto;
   a first cladding layer of a first conductivity type on said semiconductor substrate;
   an active layer on said first cladding layer;
   a second cladding layer of a second conductivity type on said active layer;
   a current confinement layer overlying said second cladding layer;
   a contact layer in said current confinement layer;
   a second electrode connected to said contact layer; and
   said first cladding layer, said second cladding layer, and said active layer comprising a II–VI group compound and said current confinement layer comprising a metal oxide having a thermal conductivity which is not less than 0.01 cal/cm·s·°C.

2. A semiconductor laser according to claim 1 wherein said current confinement layer is provided on an upper portion of a p-type semiconductor layer as a buffer layer, said buffer layer being provided on said second cladding layer.

3. A semiconductor laser according to claim 1 wherein a silicon layer is provided between said current confinement layer and said second electrode.

4. A semiconductor laser according to claim 1 wherein said contact layer is strip-shaped and is positioned in and runs along within an opening in said current confinement layer.

5. A semiconductor laser, comprising:
   a semiconductor substrate having a first electrode connected thereto;
   a first cladding layer of a first conductivity type on said semiconductor substrate;
   an active layer on said first cladding layer;
   a second cladding layer of second conductivity type on said active layer;
   a current confinement layer overlying said second cladding layer;
   a contact layer in said current confinement layer;
   a second electrode connected to said contact layer; and
   said first cladding layer, said second cladding layer, and said active layer comprising a II–VI group compound and said current confinement layer comprising an element selected from the group consisting of Al$_2$O$_3$, MgO, and BeO.

6. A semiconductor laser according to claim 1 wherein a buffer layer is provided between said current confinement layer having said contact layer therein and said second cladding layer.

7. A semiconductor laser according to claim 5 wherein a buffer layer is provided between said current confinement layer having said contact layer therein and said second cladding layer.

8. A semiconductor laser according to claim 5 wherein a silicon layer is provided between said current confinement layer and said second electrode.

9. A semiconductor laser, comprising:
   a semiconductor substrate having a first electrode connected thereto;
   a first cladding layer of a first conductivity type on said semiconductor substrate;
   an active layer on said first cladding layer;
   a second cladding layer of a second conductivity type on said active layer;
   a second conductivity type buffer layer on said second cladding layer;
   a current confinement layer on said cladding layer and having an opening therein;
   a contact layer in said opening of said current confinement layer;
   a second electrode connected to said contact layer; and
   said first cladding layer, said second cladding layer, and said active layer comprising a II–VI group compound and said current confinement layer comprising a metal oxide having a thermal conductivity which is not less than 0.01 cal/cm·s·°C.

10. A semiconductor laser, comprising:
    a semiconductor substrate having a first electrode connected thereto;
    a first cladding layer of a first conductivity type on said semiconductor substrate;
    an active layer on said first cladding layer;
    a second cladding layer of second conductivity type on said active layer;
    a second conductivity type buffer layer on said second cladding layer;
    a current confinement layer on said cladding layer and having an opening therein;
    a contact layer in said opening of said current confinement layer;
    a second electrode connected to said contact layer; and
    said first cladding layer, said second cladding layer, and said active layer comprising a II–VI group compound and said current confinement layer comprising an element selected from the group consisting of Al$_2$O$_3$, MgO, and BeO.

* * * * *